US012720792B2

(12) United States Patent
Yang et al.

(10) Patent No.: US 12,720,792 B2
(45) Date of Patent: Aug. 25, 2026

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Chao Yang, Suzhou City (CN); Chunhua Zhou, Suzhou City (CN); Qiyue Zhao, Suzhou City (CN); Jingyu Shen, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1207 days.

(21) Appl. No.: 17/635,004

(22) PCT Filed: Dec. 31, 2021

(86) PCT No.: PCT/CN2021/143780

§ 371 (c)(1),
(2) Date: Feb. 14, 2022

(87) PCT Pub. No.: WO2023/123392

PCT Pub. Date: Jul. 6, 2023

(65) Prior Publication Data

US 2024/0055509 A1 Feb. 15, 2024

(51) Int. Cl.
*H10D 30/47* (2025.01)
*H10D 30/01* (2025.01)
(Continued)

(52) U.S. Cl.
CPC ......... *H10D 30/477* (2025.01); *H10D 30/015* (2025.01); *H10D 62/8503* (2025.01); *H10D 64/513* (2025.01)

(58) Field of Classification Search
CPC .. H10D 62/8503; H10D 30/015; H10D 30/47; H10D 30/471; H10D 30/472;
(Continued)

(56) References Cited

U.S. PATENT DOCUMENTS

| | | | | |
|---|---|---|---|---|
| 9,536,984 | B2 * | 1/2017 | Azize | H10D 30/015 |
| 10,804,387 | B1 * | 10/2020 | Chang | H10D 62/107 |

(Continued)

FOREIGN PATENT DOCUMENTS

| | | | |
|---|---|---|---|
| CN | 101232046 | A | 7/2008 |
| CN | 102017160 | A | 4/2011 |

(Continued)

OTHER PUBLICATIONS

International Search Report and Written Opinion of the corresponding PCT application No. PCT/CN2021/143780 mailed on Jul. 19, 2022.

*Primary Examiner* — Eric A. Ward
(74) *Attorney, Agent, or Firm* — Li & Cai Intellectual Property (USA) Office

(57) ABSTRACT

A nitride-based semiconductor device includes a first nitride-based semiconductor layer, a nitride-based multiple semiconductor layer, a gate electrode, a gate insulator layer, and a source electrode. The first nitride-based semiconductor layer includes a drift region and at least two doped barrier regions defining an aperture in the drift region. The nitride-based multiple semiconductor layer structure is disposed over the first nitride-based semiconductor layer and has a first heterojunction and a second heterojunction which are separated from each other. The gate electrode is received by the nitride-based multiple semiconductor layer structure and vertically aligns with the aperture in the drift region. The gate insulator layer is disposed between the nitride-based multiple semiconductor layer structure and the gate electrode. The source electrode is disposed over the first nitride- (Continued)

1A based semiconductor layer and abuts against the first and second heterojunctions of the nitride-based multiple semiconductor layer structure.

19 Claims, 7 Drawing Sheets

(51) Int. Cl.
*H10D 62/85* (2025.01)
*H10D 64/27* (2025.01)

(58) Field of Classification Search
CPC ............. H10D 30/473; H10D 30/4732; H10D 30/4735; H10D 30/4738; H10D 30/474; H10D 30/475; H10D 30/4755; H10D 30/476; H10D 30/477
See application file for complete search history.

(56) References Cited

U.S. PATENT DOCUMENTS 11,881,511 B2* 1/2024 Nidhi ................. H10D 30/4732
2009/0267078 A1* 10/2009 Mishra ................ H01L 29/2003 257/E21.403
2013/0134443 A1* 5/2013 Terano ..................... H10D 8/60 257/77
2013/0334573 A1* 12/2013 Ostermaier ....... H01L 21/30604 257/E21.403
2014/0252371 A1 9/2014 Kwak et al.
2014/0264273 A1* 9/2014 Howell ................ H10D 64/256 257/20
2015/0318387 A1 11/2015 Chiu et al.
2017/0236951 A1* 8/2017 Sun .................... H10D 62/8503 257/76
2020/0411663 A1* 12/2020 Saptharishi .......... H10D 30/474

FOREIGN PATENT DOCUMENTS

CN 103155155 A 6/2013
CN 103201844 A 7/2013
CN 103579330 A 2/2014
CN 104282746 A 1/2015
CN 111656517 A 9/2020
EP 3651205 A1 5/2020
WO 2011007483 A1 1/2011

* cited by examiner

1A

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device has a vertical HEMT structure with an operable electron accumulation layer therein.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a nitride-based semiconductor device is provided. The nitride-based semiconductor device includes a first nitride-based semiconductor layer, a nitride-based multiple semiconductor layer, a gate electrode, a gate insulator layer, and a source electrode. The first nitride-based semiconductor layer includes a drift region and at least two doped barrier regions defining an aperture in the drift region. The nitride-based multiple semiconductor layer structure is disposed over the first nitride-based semiconductor layer and has a first heterojunction and a second heterojunction which are separated from each other. The gate electrode is received by the nitride-based multiple semiconductor layer structure and vertically aligns with the aperture in the drift region. The gate insulator layer is disposed between the nitride-based multiple semiconductor layer structure and the gate electrode. The source electrode is disposed over the first nitride-based semiconductor layer and abuts against the first and second heterojunctions of the nitride-based multiple semiconductor layer structure.

In accordance with one aspect of the present disclosure, a method for manufacturing a semiconductor device is provided. The method includes steps as follows. At least two doped barrier regions are formed in a first nitride-based semiconductor layer to define an aperture in a drift region. A nitride-based multiple semiconductor layer structure is formed over a first nitride-based semiconductor layer, including forming at least two heterojunctions which are separated from each other. A portion of the nitride-based multiple semiconductor layer structure is removed to form a trench. A gate insulator layer is formed in the trench. A gate electrode is formed in the trench such that the gate electrode is wrapped by the gate insulator layer and vertically aligning with the aperture in the drift region. A source electrode is formed in contact with the nitride-based multiple semiconductor layer structure to electrically couple with the heterojunctions.

In accordance with one aspect of the present disclosure, a nitride-based semiconductor device is provided. The nitride-based semiconductor device includes a first nitride-based semiconductor layer, a nitride-based multiple semiconductor layer structure, a gate insulator layer, and a gate electrode. The first nitride-based semiconductor layer includes a drift region and at least two doped barrier regions defining an aperture in the drift region. The nitride-based multiple semiconductor layer structure is disposed over the first nitride-based semiconductor layer and has a first heterojunction and a second heterojunction which are separated from each other. The nitride-based multiple semiconductor layer structure is recessed to have a trench defined by an inner surface of the nitride-based multiple semiconductor layer structure. The gate insulator layer is disposed in the trench and covers the inner surface of the nitride-based multiple semiconductor layer structure. The gate electrode fills into the trench and received by the gate insulator layer.

With such configuration, a semiconductor device can have a vertical structure with four heterojunctions which can serve as four channels. Carriers can be injected from the source electrodes into the aperture in the drift region through the electron accumulation layer at on-state. The four-channels configuration can reduce on-state resistance. In addition, there are two channels at a side of the gate electrode, so the injection from the source electrode to the aperture in the drift region can remain even one of the channels fails.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
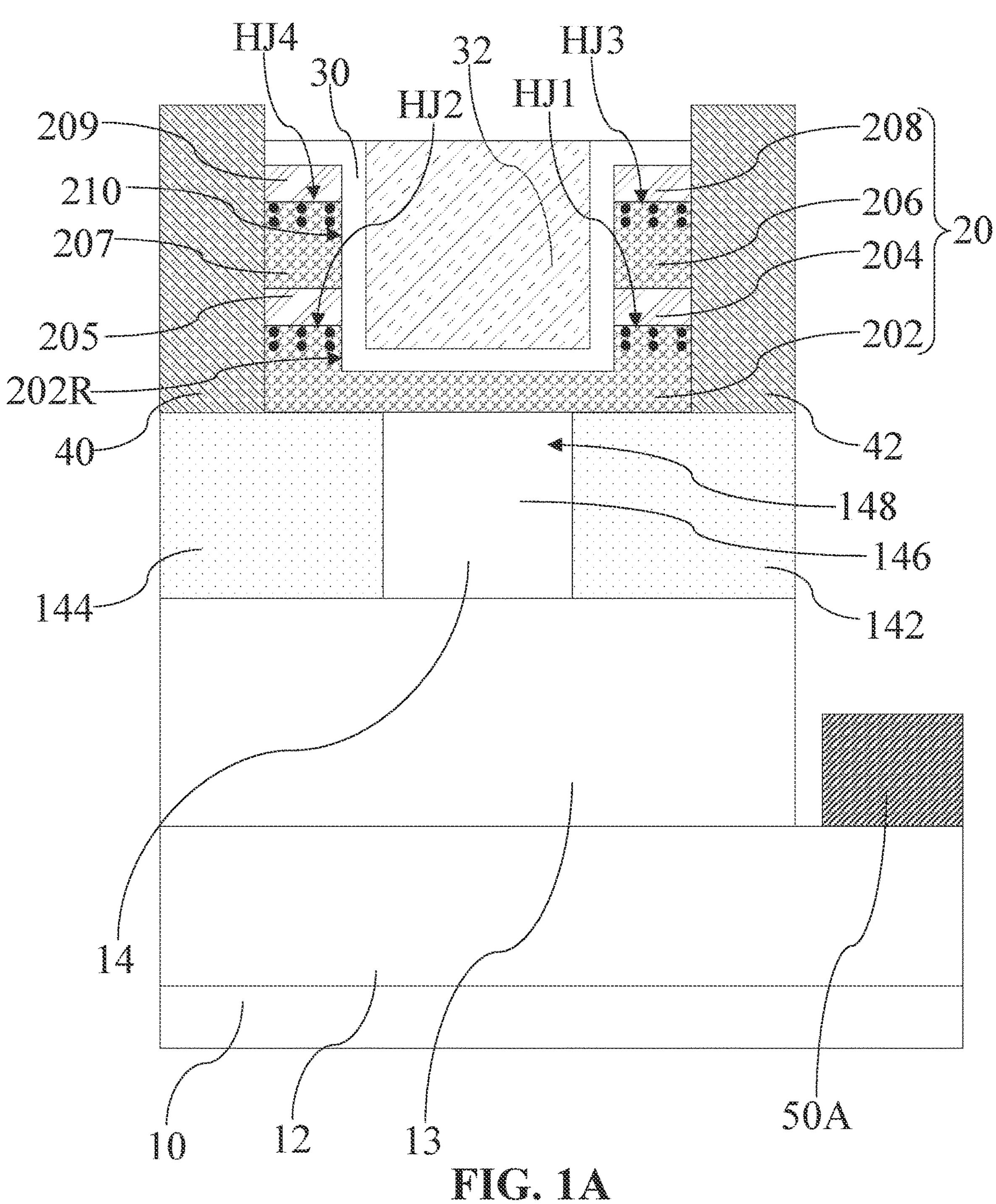
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In the present disclosure, a doping region can have a conductive type expressed as a doping type. For example, a doping type maybe n-type or p-type. The term "n-type" may include a plus/minus sign. For example, with respect to n-type dopant, there are three conductive types, including "n+", "n−", and "n". An n+ doping region has a doping concentration higher/heavier than an n-doping region; and an n-doping region has a doping concentration than higher an n−-doping region. Doping regions of the same symbol may have different absolute doping concentrations. For example, two different n doping regions may have the same or different absolute doping concentrations. The definition can be applied to the p-type doping.

In some embodiments, the n-type dopant can include, but are not limited to, silicon (Si), carbon (C), germanium (Ge), Selenium (Se), tellurium (Te), or the like. In some embodiments, the p-type dopant can include, but are not limited to, magnesium (Mg), beryllium (Be), zinc (Zn), or the like. In the exemplary illustrations of the present disclosure, although the element is illustrated as a single layer, it can include multiple layers therein.

FIG. 1A is a vertical cross-sectional view of a semiconductor device 1A according to some embodiments of the present disclosure. The semiconductor device 1A includes a substrate 10, nitride-based semiconductor layers 12, 13, 14, a nitride-based multiple semiconductor layer structure 20, a gate insulator layer 30, a gate electrode 32, source electrodes 40 and 42, and a drain electrode 50A.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof. In some embodiments, the material of the substrate 10 can include a silicon substrate with a <111> orientation.

The nitride-based semiconductor layer 12 is disposed on the substrate 10. The nitride-based semiconductor layer 12 can be doped to have n conductivity type. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$. For example, the nitride-based semiconductor layer 12 can be a n-type GaN layer.

The nitride-based semiconductor layer 13 is disposed on the nitride-based semiconductor layer 12. The nitride-based semiconductor layer 13 can serve as a buffer layer. The nitride-based semiconductor layer 13 can be in contact with the nitride-based semiconductor layer 12. The nitride-based semiconductor layer 13 can be configured to reduce lattice and thermal mismatches between the nitride-based semiconductor layers 12 and 14, thereby curing defects due to the mismatches/difference. The nitride-based semiconductor layer 13 may include a III-V compound. The III-V compound can include, for example but are not limited to, aluminum, gallium, indium, nitrogen, or combinations thereof. Accordingly, the exemplary materials of the nitride-based semiconductor layer 13 can further include, for example but are not limited to, GaN, AlN, AlGaN, InAlGaN, or combinations thereof.

The nitride-based semiconductor layer 14 is disposed on/over the nitride-based semiconductor layer 13. The nitride-based semiconductor layer 14 can include two doped barrier regions 142 and 144 to define an aperture 146 therebetween. The aperture 146 is in a drift region 148 in the nitride-based semiconductor layer 14. The aperture 146 can allow current to vertically flow through the nitride-based semiconductor layer 14. For example, at least one current can flow from a top to a bottom of the nitride-based semiconductor layer 14 through the aperture 146 in the drift region 148.

In the nitride-based semiconductor layer 14, the aperture 146 can have a conductivity higher than those of the doped barrier regions 142 and 144. To achieve it, in some embodiments, the doped barrier regions 142 and 144 can have p conductivity type. In some embodiments, p-dopants can be introduced into the doped barrier regions 142 and 144. In some embodiments, silicon ions can be introduced into the aperture 146 to improve the conductivity of the aperture 146. The nitride-based semiconductor layer 14 can be referred to as a current blocking layer.

The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$. For example, the nitride-based semiconductor layer 14 may be a GaN layer, and the doped barrier regions 142 and 144 are formed from P—GaN.

The nitride-based multiple semiconductor layer structure 20 is disposed over the nitride-based semiconductor layers 12, 13, and 14. The nitride-based multiple semiconductor layer structure 20 includes nitride-based semiconductor layers 202, 204, 205, 206, 207, 208, and 209.

The nitride-based semiconductor layer 202 is disposed over the nitride-based semiconductor layer 14. The nitride-based semiconductor layer 202 is in contact with the nitride-based semiconductor layer 14. The nitride-based semiconductor layer 202 is in contact with the doped barrier regions 142 and 144. The nitride-based semiconductor layer 202 is in contact with the aperture 148 in the drift region 146. The nitride-based semiconductor layer 202 has a trench 202R. The trench 202R of the nitride-based semiconductor layer 202 can be achieved by a thinner portion of the nitride-based semiconductor layer 202. The nitride-based semiconductor layer 202 has a left top surface and a right top surface which are spaced apart from each other. The trench 202R is located between the left and right top surfaces. The left and right top surfaces are spaced apart from each other by the trench 202R.

The nitride-based semiconductor layer 204 is disposed on the right top surface of the nitride-based semiconductor layer 202. The nitride-based semiconductor layer 204 is in contact with the nitride-based semiconductor layer 202. The nitride-based semiconductor layer 204 has a bandgap higher than a bandgap of the nitride-based semiconductor layer 202, so as to form a heterojunction HJ1 therebetween.

The nitride-based semiconductor layer 205 is disposed on the left top surface of the nitride-based semiconductor layer 202. The nitride-based semiconductor layer 205 is in contact with the nitride-based semiconductor layer 202. The nitride-based semiconductor layer 205 has a bandgap higher than a bandgap of the nitride-based semiconductor layer 202, so as to form a heterojunction HJ2 therebetween.

The nitride-based semiconductor layer 206 is disposed on the nitride-based semiconductor layer 204. The nitride-based semiconductor layer 206 is in contact with the nitride-based semiconductor layer 204. The nitride-based semiconductor layer 206 can be formed to be thicker than the nitride-based semiconductor layer 204.

The nitride-based semiconductor layer 207 is disposed on the nitride-based semiconductor layer 205. The nitride-based semiconductor layer 207 is in contact with the nitride-based semiconductor layer 205. The nitride-based semiconductor layer 207 can be formed to be thicker than the nitride-based semiconductor layer 205.

The nitride-based semiconductor layer 208 is disposed on the nitride-based semiconductor layer 206. The nitride-based semiconductor layer 208 is in contact with the nitride-based semiconductor layer 206. The nitride-based semiconductor layer 208 has a bandgap higher than a bandgap of the nitride-based semiconductor layer 206, so as to form a heterojunction HJ3 therebetween.

The nitride-based semiconductor layer 209 is disposed on the nitride-based semiconductor layer 207. The nitride-based semiconductor layer 209 is in contact with the nitride-based semiconductor layer 207. The nitride-based semiconductor layer 209 has a bandgap higher than a bandgap of the nitride-based semiconductor layer 207, so as to form a heterojunction HJ4 therebetween.

The nitride-based semiconductor layers 204, 206, 208 are stacked on the nitride-based semiconductor layer 202 in sequence. Accordingly, the heterojunction HJ3 is located over the heterojunction HJ1. The heterojunctions HJ1 and HJ3 can extend horizontally above the aperture 148 in the drift region 146. The heterojunctions HJ1 and HJ3 are parallel with each other.

The nitride-based semiconductor layers 205, 207, 209 are stacked on the nitride-based semiconductor layer 202 in sequence. Accordingly, the heterojunction HJ4 is located over the heterojunction HJ2. The heterojunctions HJ4 and HJ2 can extend horizontally above the aperture 148 in the drift region 146. The heterojunctions HJ4 and HJ2 are parallel with each other.

The exemplary materials of the nitride-based semiconductor layers 202, 204, 205, 206, 207, 208, and 209 can include, for example but are not limited to, nitrides or group III-V compounds, such as GaN, InN, $In_xAl_yGa_{(1-x-y)}N$ where $x+y\leq 1$, $Al_yGa_{(1-y)}N$ where $y\leq 1$.

In some embodiments, the nitride-based semiconductor layers 202, 206, and 207 have the same material. In some embodiments, the nitride-based semiconductor layers 204, 205, 208, and 209 have the same material. In some embodiments, the nitride-based semiconductor layers 202, 206, and 207 have at least one material different than that of the nitride-based semiconductor layers 204, 205, 208, and 209. In some embodiments, the heterojunctions HJ1, HJ2, HJ3, and HJ4 can be formed by two different III-V layers selected from AlGaN, GaN, InAlN, AlN, or combinations thereof.

The exemplary materials of the nitride-based semiconductor layers 202, 204, 205, 206, 207, 208, and 209 can be selected so the heterojunctions HJ1, HJ2, HJ3, and HJ4 are formed with different electron affinities. For example, when the nitride-based semiconductor layers 202, 206, and 207 are undoped GaN layers having a bandgap of approximately 3.4 eV, the nitride-based semiconductor layers 204, 205, 208, and 209 can be selected as AlGaN layers having bandgap of approximately 4.0 eV.

As such, the nitride-based semiconductor layers 202, 206, 207 and the nitride-based semiconductor layers 204, 205, 208, and 209 can serve as channel layers and barrier layers, respectively. A triangular well potential is generated at a bonded interface between the channel and barrier layers, so that electrons accumulate in the triangular well, thereby generating two-dimensional electron gas (2DEG) regions adjacent to the heterojunctions HJ1, HJ2, HJ3, and HJ4.

Accordingly, the semiconductor device 1A is available to include at least one GaN-based high-electron-mobility transistor (HEMT). In some embodiments, the semiconductor device 1A include at least one vertical GaN-based HEMT. The 2DEG regions adjacent to the heterojunctions HJ1, HJ2, HJ3, and HJ4 can transport carriers laterally.

The source electrodes 40 and 42 are disposed on/over/above the nitride-based semiconductor layer 14. The source electrodes 40 and 42 can make contact with doped barrier regions 142 and 144 of the nitride-based semiconductor layer 14. The nitride-based semiconductor layers 202, 204, 205, 206, 207, 208, and 209 of the nitride-based multiple semiconductor layer structure 20 are located between the source electrodes 40 and 42. The source electrodes 40 and 42 can abut against sidewalls of the nitride-based multiple semiconductor layer structure 20. The source electrodes 40 and 42 can abut against the heterojunctions HJ1, HJ2, HJ3, and HJ4 among the nitride-based semiconductor layers 202, 204, 205, 206, 207, 208, and 209. The source electrodes 40 and 42 can make contact with the heterojunctions HJ1, HJ2, HJ3, and HJ4 among the nitride-based semiconductor layers 202, 204, 205, 206, 207, 208, and 209. The source electrodes 40 and 42 electrically couple with the heterojunctions HJ1, HJ2, HJ3, and HJ4. The source electrodes 40 and 42 can electrically couple with the 2DEG region adjacent to the heterojunction HJ1, HJ2, HJ3, and HJ4.

In some embodiments, the source electrodes 40 and 42 can include, for example but are not limited to, metals, alloys, doped semiconductor materials (such as doped crystalline silicon), compounds such as silicides and nitrides, other conductor materials, or combinations thereof. The exemplary materials of the source electrodes 40 and 42 can include, for example but are not limited to, Ti, AlSi, TiN, or combinations thereof. The source electrodes 40 and 42 may be a single layer, or plural layers of the same or different composition.

In some embodiments, the source electrodes 40 and 42 form ohmic contacts with the nitride-based semiconductor layers 202, 204, 205, 206, 207, 208, and 209. The ohmic contacts can be achieved by applying Ti, Al, or other suitable materials to the source electrodes 40 and 42. In some embodiments, each of the source electrodes 40 and 42 is formed by at least one conformal layer and a conductive filling. The conformal layer can wrap the conductive filling. The exemplary materials of the conformal layer can include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The nitride-based multiple semiconductor layer structure 20 is recessed to have a trench 210. The trench 210 can be defined by at least one inner surface of the nitride-based multiple semiconductor layer structure 20. The nitride-based semiconductor layer 202 can define a bottom of the trench 210. The trench 202R of the nitride-based semiconductor layer 202 can serve as a bottom of the trench 210. The nitride-based semiconductor layers 204 and 205 are spaced apart from each other by the trench 210. The nitride-based semiconductor layers 206 and 207 are spaced apart from each other by the trench 210. The nitride-based semiconductor layers 208 and 209 are spaced apart from each other by the trench 210.

The gate insulator layer 30 is disposed over the nitride-based multiple semiconductor layer structure 20. The gate insulator layer 30 is located within the trench 210. The gate insulator layer 30 covers the inner surface of the nitride-based multiple semiconductor layer structure 20. The gate insulator layer 30 extends from a top surface of the nitride-based semiconductor layer 208 to the nitride-based semiconductor layer 202. The gate insulator layer 30 extends from a top surface of the nitride-based semiconductor layer 209 to the nitride-based semiconductor layer 202.

The exemplary materials of the gate insulator layer 30 can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The gate electrode 32 is disposed over the nitride-based multiple semiconductor layer structure 20 and the gate insulator layer 30. The gate insulator layer 30 is located between the nitride-based multiple semiconductor layer structure 20 and the gate electrode 32. The gate electrode 32 is received by the nitride-based multiple semiconductor layer structure 20. For example, the recess 202R of the nitride-based semiconductor layer 202 can receive the gate electrode 32. The gate electrode 32 has a bottom surface located within a thickness of the nitride-based semiconductor layer 202. The nitride-based semiconductor layer 202 further has a bottom separating the gate electrode 32 from the nitride-based semiconductor layer 14. The gate electrode 32 penetrates the nitride-based semiconductor layer 204, 205, 206, 207, 208, and 209.

The gate electrode 32 vertically aligns with the aperture 148 in the drift region 146. Herein, the phrase “vertically aligning” includes a configuration that the gate electrode 32 is immediately located above the aperture 148 in the drift region 146. The gate electrode 32 can extend upward from a position lower than the heterojunctions HJ1 and HJ2 to a position higher than the heterojunctions HJ3 and HJ4. That is, a bottom-most surface of the gate electrode 32 is at a position lower than the heterojunctions HJ1 and HJ2 and a top-most surface of the gate electrode 32 is at a position higher than the heterojunctions HJ3 and HJ4.

In the trench 210, the gate insulator layer 30 can wrap around sidewalls and a bottom surface of the gate electrode 32. Accordingly, the gate electrode 32 in the trench 210 can be separated from the nitride-based semiconductor layer 14 and the nitride-based multiple semiconductor layer structure 20 by the gate insulator layer 30. The gate electrode 32 in the trench 210 can be separated from the heterojunctions HJ1-HJ4 by the gate insulator layer 30. In the exemplary illustration of the present embodiment, the trench 210 of the nitride-based multiple semiconductor layer structure 20 is fully filled with the gate insulator layer 30 and the gate electrode 32.

The exemplary materials of the gate electrode 32 may include metals or metal compounds. The gate electrode 32 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The drain electrode 50A is disposed on the substrate 10 and the nitride-based semiconductor layer 12. The drain electrode 50A is connected to the nitride-based semiconductor layer 12. The drain electrode 50A can make contact with the nitride-based semiconductor layer 12. The materials of the drain electrode 50A can be identical with or similar with those of the source electrodes 40 and 42.

Figure 1B:
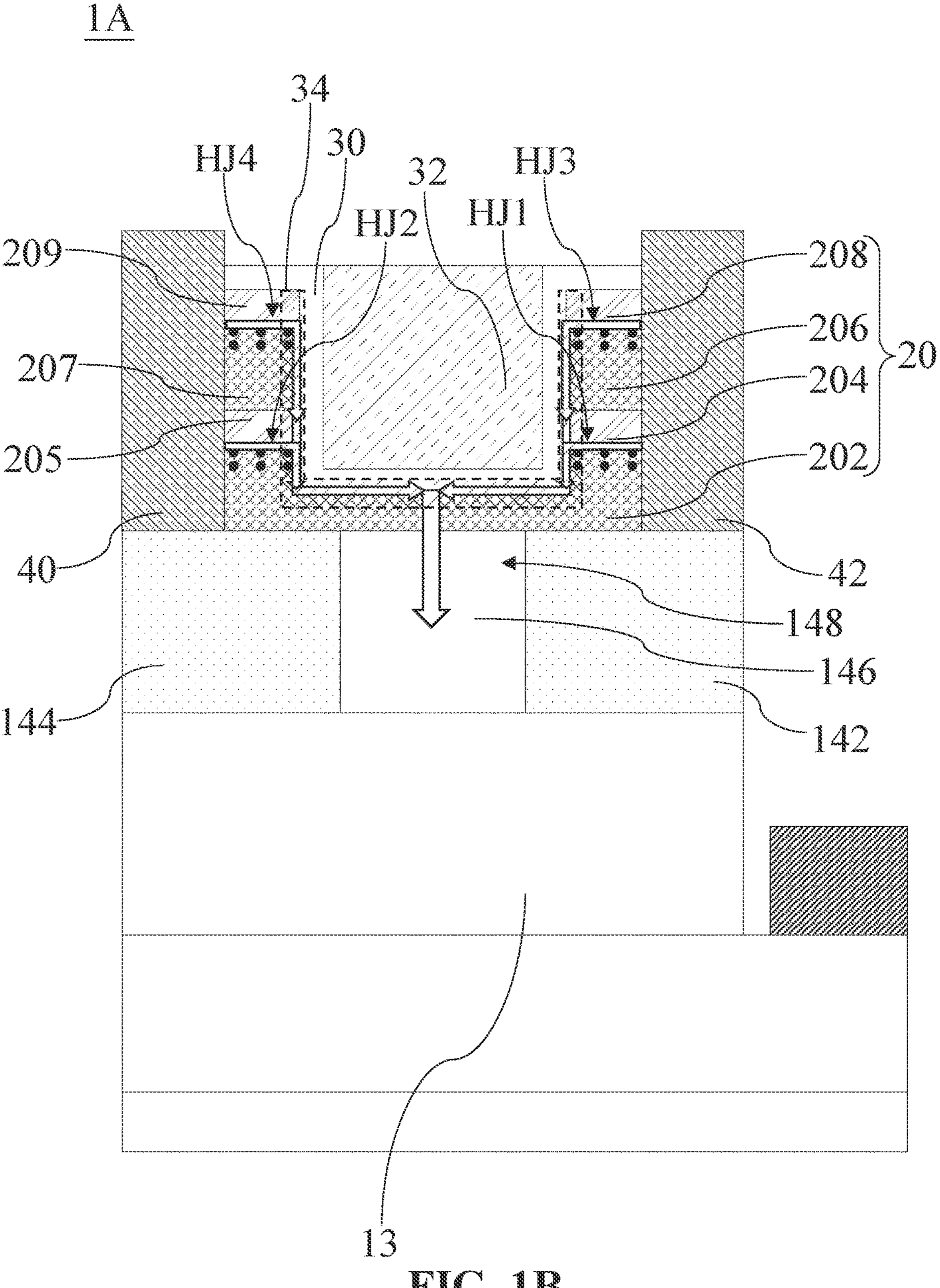
FIG. 1B depicts the semiconductor device of FIG. 1A operated at a switch-on state according to some embodiments of the present disclosure.

The configuration above is made for switching the operation mode of the semiconductor device 1A into on-state. The operation mode of the semiconductor device 1A is described as follow. FIG. 1B depicts the semiconductor device 1A of FIG. 1A operated at a switch-on state according to some embodiments of the present disclosure.

In on-state, an electron accumulation layer 34 can be formed in the gate insulator layer 30. More specifically, when the gate electrode 32 is biased, an electron accumulation layer 34 is formed along an interface between the gate insulator layer 30 and the nitride-based multiple semiconductor layer structure 20. The electron accumulation layer 34 is formed/generated/created in response to the biased gate electrode 32. In this regard, the electron accumulation layer 34 is operable to inject electrons so it can transport at least one carrier flow. As the indicated by the arrow, the carrier flow can be injected into the nitride-based semiconductor layer 202 of the nitride-based multiple semiconductor layer structure 20 and then into the aperture 148 in the drift region 146. The carrier flow can be injected from the source electrode 40 via the heterojunctions HJ1 and HJ2 (i.e., the 2DEG regions there). The carrier flow can be injected from the source electrode 42 via the heterojunctions HJ3 and HJ4 (i.e., the 2DEG regions there). In some embodiments, the carrier flow may be a current flow.

The four heterojunctions HJ1 to HJ4 can serve as four channels to inject electrons into the aperture 148 in the drift region 146 through the electron accumulation layer 34. The four-channels configuration can reduce on-state resistance (Ron). In addition, there are two channels at a single side of the gate electrode 32, so the injection from the source electrode 40 or 42 to the aperture 148 in the drift region 146 can remain even one of the channels fails.

In off-state, as a voltage applied to the gate electrode 32 is below a threshold voltage, the semiconductor device 1A is in a reverse operation, and carriers will hardly flow through the gate insulator layer 30. Furthermore, in off-state, the doped barrier regions 142 and 144 and the nitride-based semiconductor layer 13 can form a reverse PN junction, so as to block carrier flow. This is the mechanism for achieving off-state, so high breakdown voltage can be achieved.

Briefly, with such the configuration, the semiconductor device 1A can be switched between on-state and off-state, which is determined according to the applied voltage.

In some embodiments, the nitride-based semiconductor layers 204 and 208 can have different thicknesses than each other. In some practical cases, a thickness of a barrier layer is related to a carrier concentration of corresponding 2DEG region. Therefore, the nitride-based semiconductor layers 204 and 208 with the different thicknesses can modulate the corresponding 2DEG regions to have different carrier concentrations.

In some embodiments, the nitride-based semiconductor layers 205 and 209 can have different thicknesses than each other. In some practical cases, a thickness of a barrier layer is related to a carrier concentration of corresponding 2DEG region. Therefore, the nitride-based semiconductor layers 205 and 209 with the different thicknesses can modulate the corresponding 2DEG regions to have different carrier concentrations.

In some embodiments, the nitride-based semiconductor layers 204 and 208 can have concentrations with respect to a group III element. For example, the nitride-based semiconductor layers 204 and 208 may have different aluminum concentrations. In some practical cases, a concentration of a group III element in a barrier layer is related to a carrier concentration of corresponding 2DEG region. Therefore, the nitride-based semiconductor layers 204 and 208 with the different group III element concentrations can modulate the corresponding 2DEG regions to have different carrier concentrations.

In some embodiments, the nitride-based semiconductor layers 205 and 209 can have concentrations with respect to a group III element. For example, the nitride-based semiconductor layers 205 and 209 may have different aluminum concentrations. In some practical cases, a concentration of a group III element in a barrier layer is related to a carrier concentration of corresponding 2DEG region. Therefore, the nitride-based semiconductor layers 205 and 209 with the different group III element concentrations can modulate the corresponding 2DEG regions to have different carrier concentrations.

Different stages of a method for manufacturing the semiconductor device 1A are shown in FIG. 2A, FIG. 2B, FIG. 2C, FIG. 2D, and FIG. 2E as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
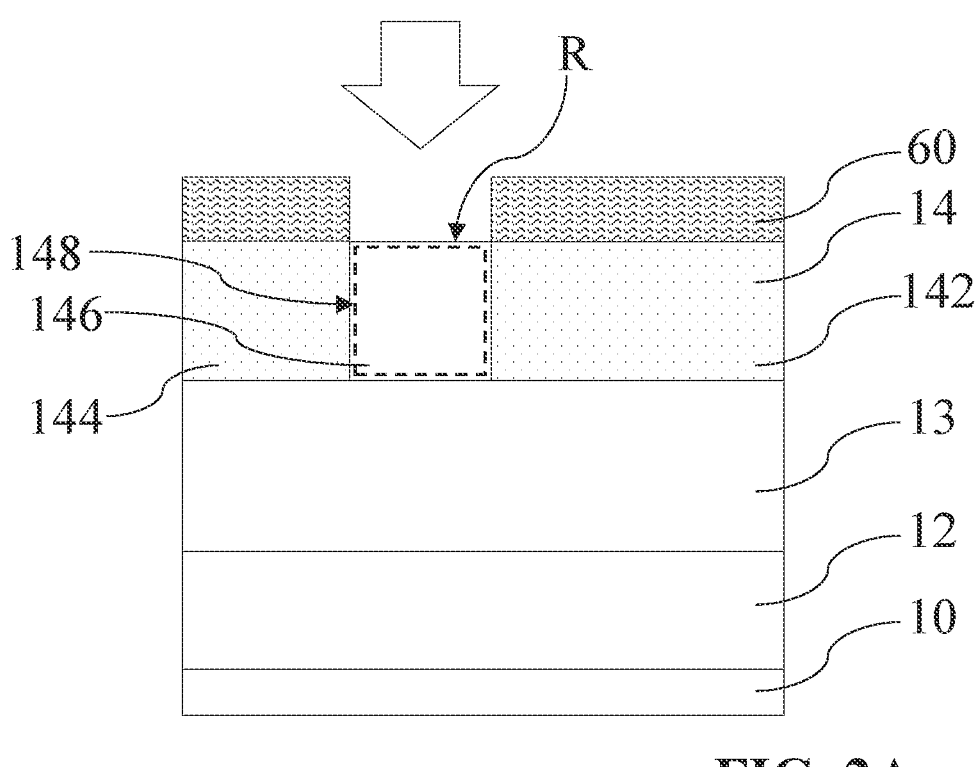
FIG. 2A, FIG. 2B, FIG. 2C, FIG. 2D, FIG. 2E, and FIG. 2F show different stages of a method for manufacturing a semiconductor device according to some embodiments of the present disclosure.

Referring to FIG. 2A, a substrate 10 is provided. Nitride-based semiconductor layers 12 and 13 can be formed over the substrate 10 in sequence by using deposition techniques. A nitride-based semiconductor layer 14 is formed over the nitride-based semiconductor layer 13 by using deposition techniques. A mask layer 60 is formed over the nitride-based semiconductor layer 14. The mask layer 60 has an opening to expose a portion of the nitride-based semiconductor layer 14. The nitride-based semiconductor layer 14 has the doped barrier regions 142 and 144. A region R between the doped barrier regions 142 and 144 of the nitride-based semiconductor layer 14 is exposed from the mask layer 60.

An implantation process can be performed on the region R of the nitride-based semiconductor layer 14, so as to improve the conductivity of the region R of the nitride-based semiconductor layer 14. After the implantation process, the region R of the nitride-based semiconductor layer 14 can become a drift region 146 and has the conductivity improved so as to form an aperture 148 in the drift region 146.

Figure 2B:
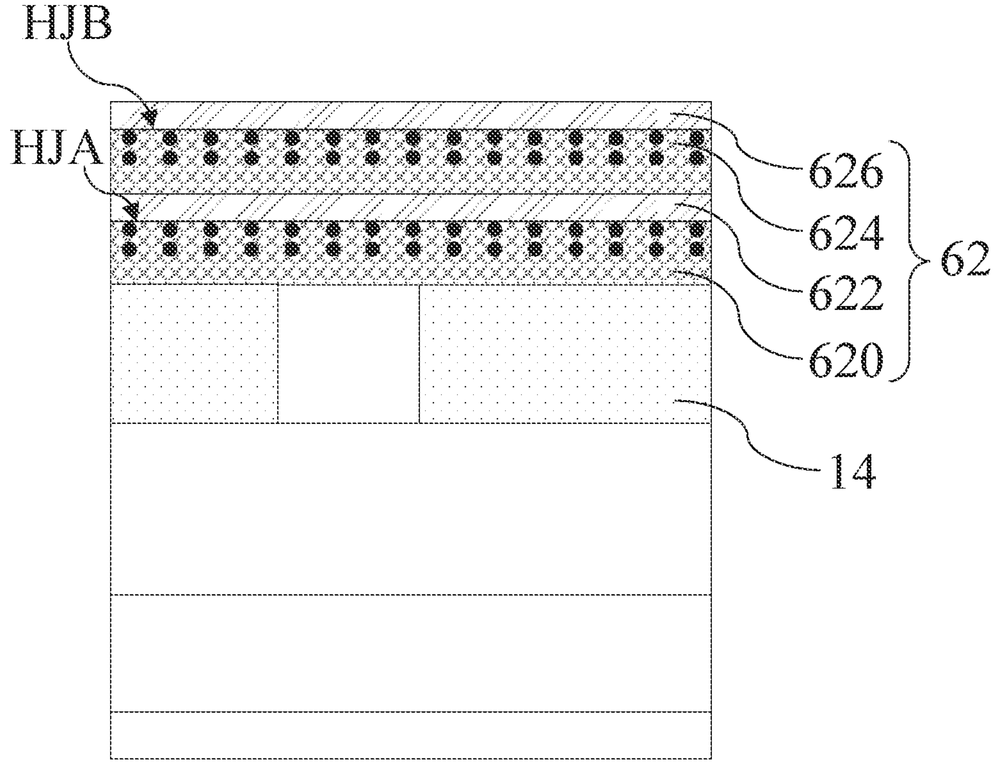

Referring to FIG. 2B, the mask layer 60 is removed, and then a nitride-based multiple semiconductor layer structure 62 is formed over the nitride-based semiconductor layer 14. The nitride-based multiple semiconductor layer structure 62 can be formed by stacking nitride-based semiconductor layers 620, 622, 624, and 626 in sequence. There are at least two heterojunctions HJA and HJB formed among the nitride-based semiconductor layers 620, 622, 624, and 626. The heterojunctions HJA and HJB are separated from each other. The heterojunctions HJA and HJB can be formed to be parallel with each other.

The materials of the nitride-based semiconductor layers 620, 622, 624, and 626 can be selected such that the nitride-based semiconductor layer 622 can have a bandgap higher than a bandgap of the nitride-based semiconductor layer 620 and that the nitride-based semiconductor layer 626 can have a bandgap higher than a bandgap of the nitride-based semiconductor layer 624.

Figure 2C:
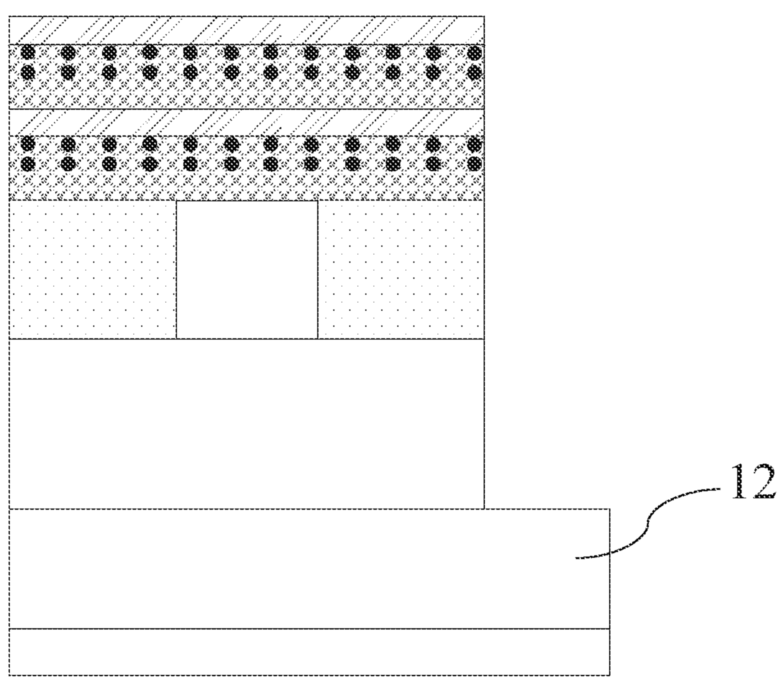

Referring to FIG. 2C, a patterning process is patterned to expose a portion of a top surface of the nitride-based semiconductor layer 12. An electrode/a layer can be formed on the exposed top surface of the nitride-based semiconductor layer 12.

Figure 2D:
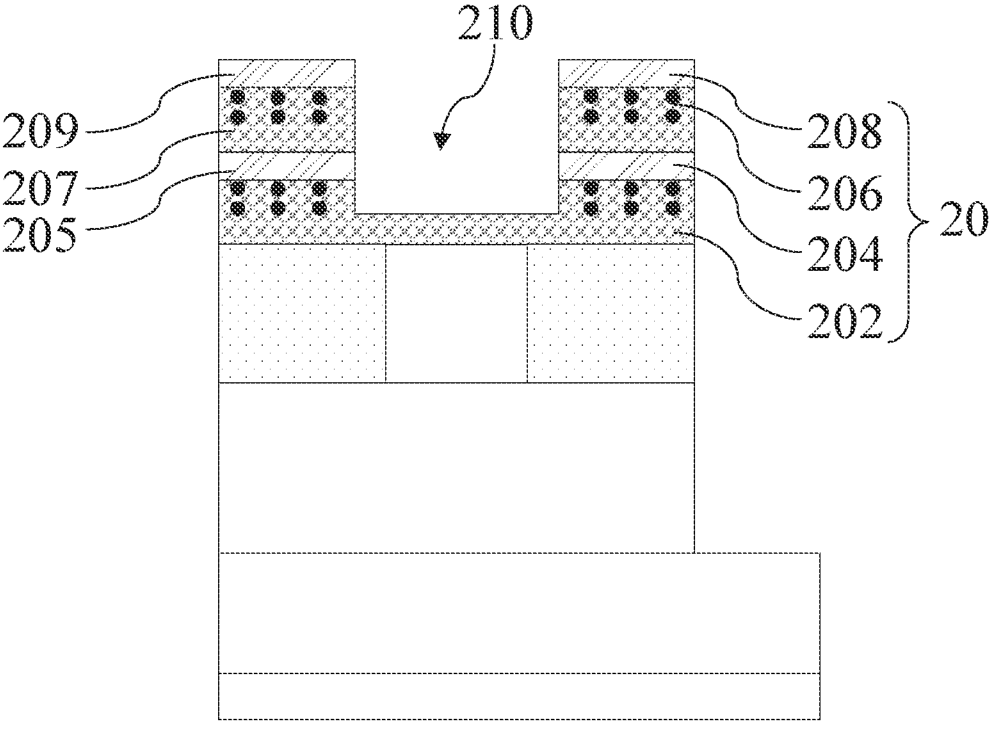

Referring to FIG. 2D, a portion of the nitride-based multiple semiconductor layer structure 60 is removed to form a nitride-based multiple semiconductor layer structure 20. Accordingly, the nitride-based multiple semiconductor layer structure 20 is formed with nitride-based semiconductor layers 202, 204, 205, 206, 207, 208, 209. After the removal of the portion, a trench 210 is formed in the nitride-based multiple semiconductor layer structure 20. A bottom of the nitride-based semiconductor layer 202 is exposed from the trench 210.

Figure 2E:
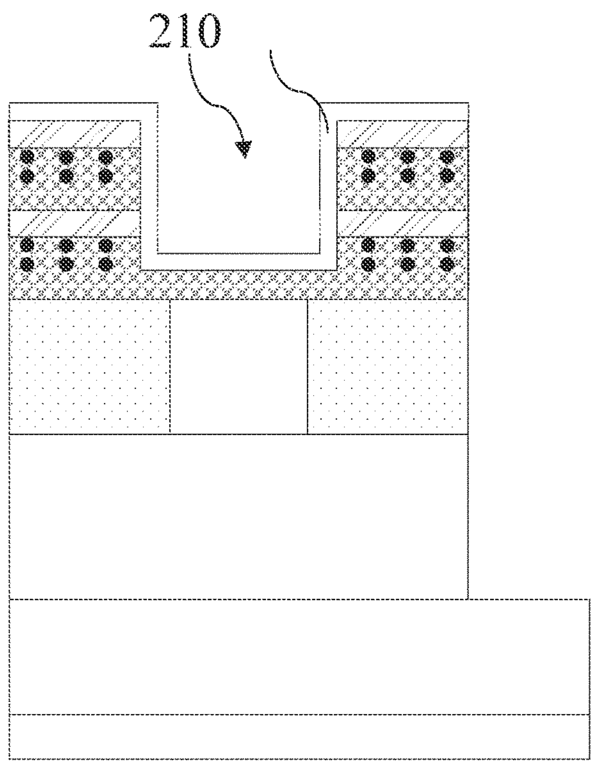

Referring to FIG. 2E, a gate insulator layer 30 is formed in the trench 210. The gate insulator layer can be formed by using deposition technique such that the resultant structure of FIG. 2D is covered by the gate insulator layer 30.

Figure 2F:
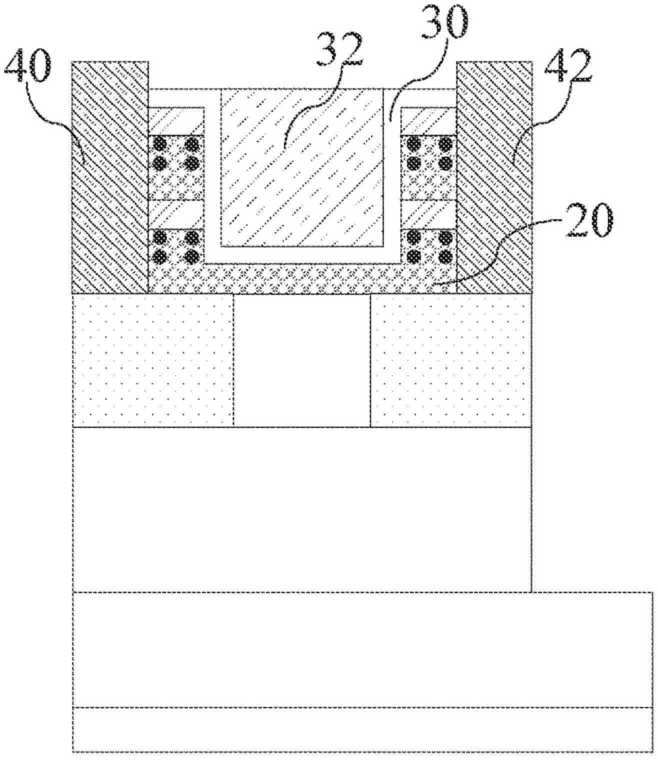

Referring to FIG. 2F, a gate electrode 32 and a pair of source electrodes 40 and 42 are formed. The gate electrode 32 is formed in the trench 210 such that the gate electrode 32 is wrapped by the gate insulator layer 30. The gate electrode 32 is formed to vertically align with the aperture in the drift region. At least one portion of the nitride-based multiple semiconductor layer structure 20 can be removed and then the source electrodes 40 and 42 are formed to abut against the nitride-based multiple semiconductor layer structure 20. The source electrodes 40 and 42 are formed in contact with the nitride-based multiple semiconductor layer structure 20 to electrically couple with the heterojunctions thereof.

After the stage of FIG. 2F, a drain electrode can be formed to connect with the structure, thereby obtain the structure of FIG. 1A.

Figure 3:
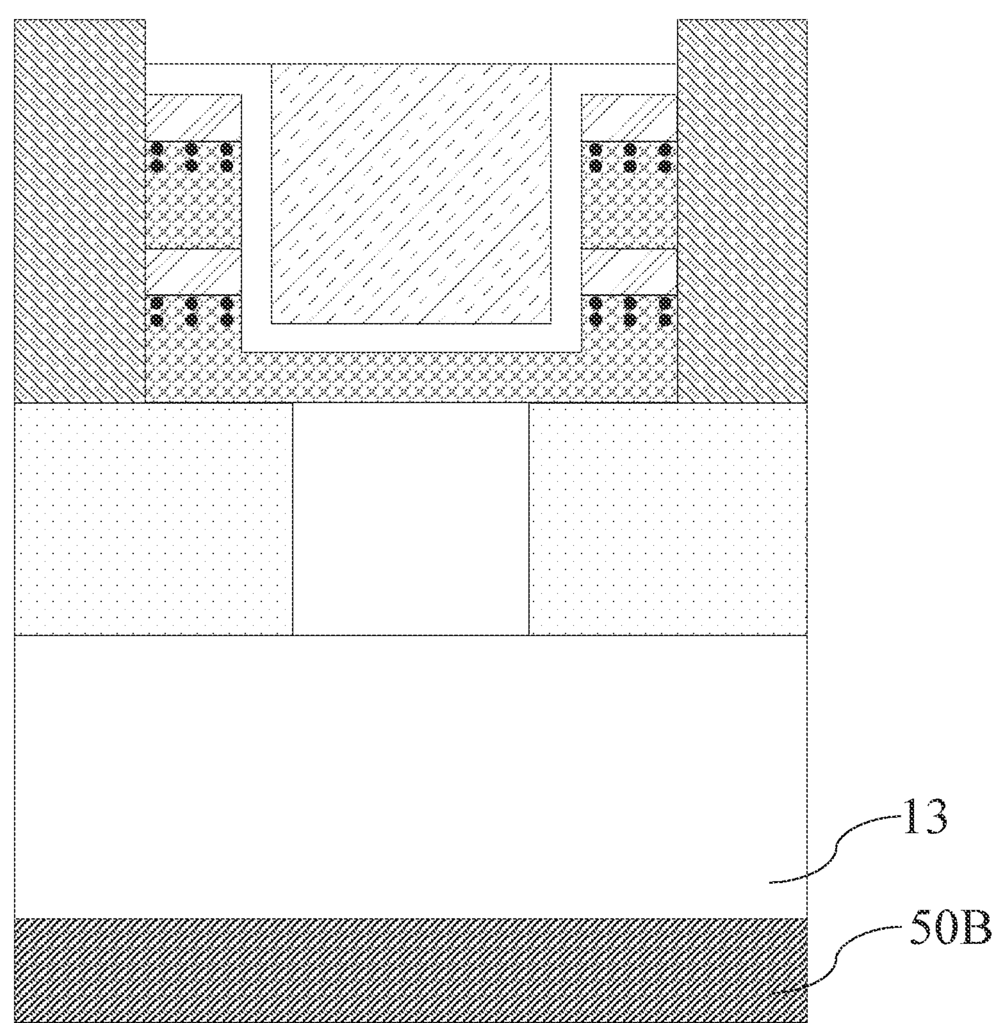
FIG. 3 is a vertical cross-sectional view of a semiconductor device 1B according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1A, except that the drain electrode 50A is replaced by a drain electrode 50B.

In the present embodiment, the substrate 10 and the nitride-based semiconductor layer 12 (see FIG. 1A) can be omitted. The drain electrode 50B is directly connected to the nitride-based semiconductor layer 13. The structure of the semiconductor device 1B can be achieved by using a temporary substrate. The temporary substrate can hold the structure of the semiconductor device 1B. During the holding, the substrate 10 and the nitride-based semiconductor layer 12 can be can be removed from the structure, and then the drain electrode 50B can be formed.

Figure 4:
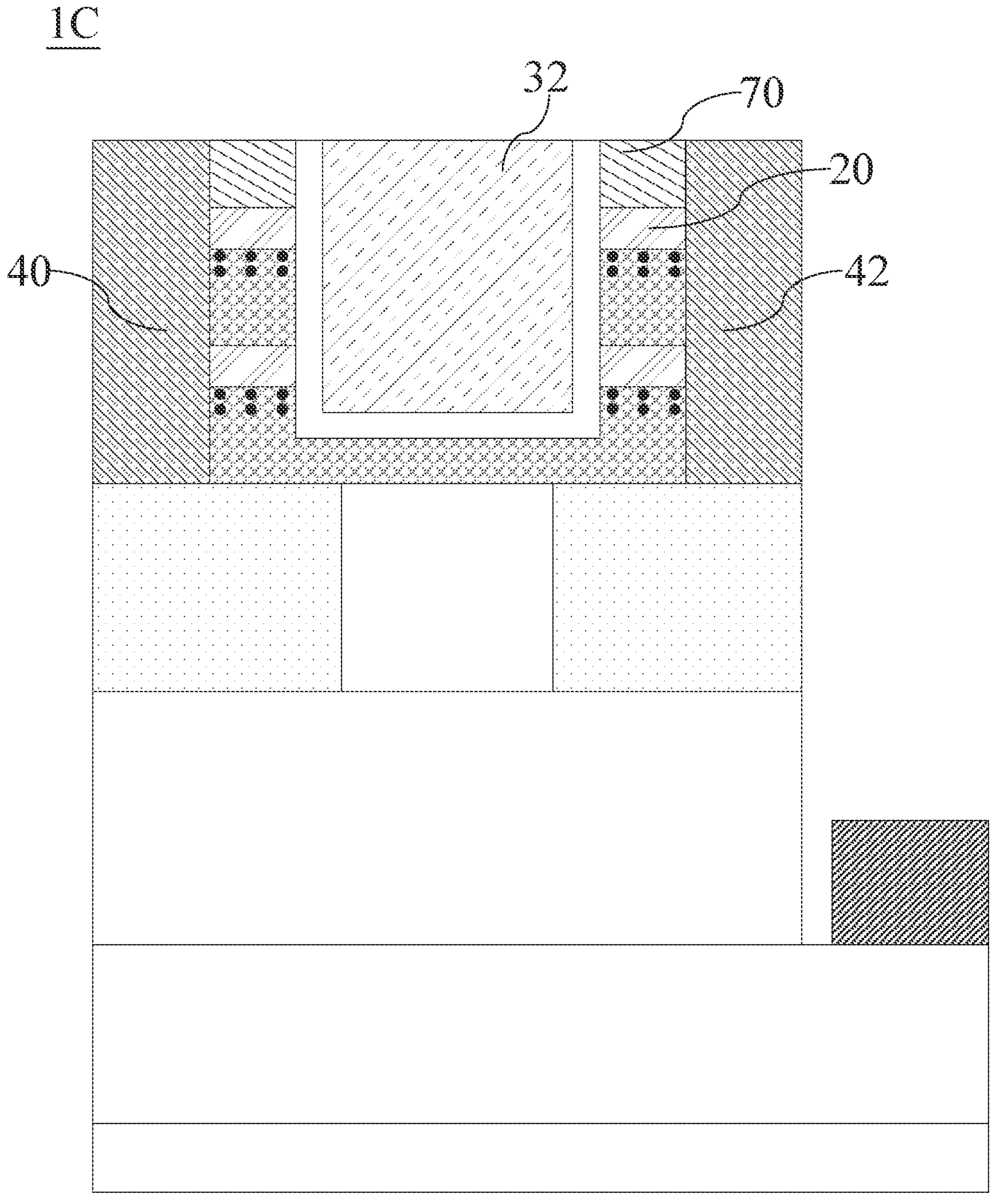
FIG. 4 is a vertical cross-sectional view of a semiconductor device 1B according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1A, except that the semiconductor device 1C further includes a passivation layer 70. The passivation layer 70 is stacked on the nitride-based multiple semiconductor layer structure 20. The passivation layer 70 can fill into a region between the gate electrode 32 and the source electrode 40. The passivation layer 70 can fill into a region between the gate electrode 32 and the source electrode 42. The layer configured to fill into these regions are selected as passivation materials rather than III-V material is due to protection purpose.

In some embodiments, the gate insulator layer 70 can include, for example but are not limited to, dielectric materials. The exemplary materials of the gate insulator layer 70 can include, for example but are not limited to, $SiO_2$, SiN, $HfO_2$, or combinations thereof.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:

a first nitride-based semiconductor layer comprising a drift region and at least two doped barrier regions defining an aperture in the drift region;

a nitride-based multiple semiconductor layer structure disposed over the first nitride-based semiconductor layer and having a first heterojunction and a second heterojunction which are separated from each other, wherein the nitride-based multiple semiconductor layer structure comprises: a second nitride-based semiconductor layer disposed over the first nitride-based semiconductor layer, and a third nitride-based semiconductor layer disposed on the second nitride-based semiconductor layer, and having a bandgap higher than a bandgap of the second nitride-based semiconductor layer, and having a material different from a material of the second nitride-based semiconductor layer, so as to form the first heterojunction therebetween, wherein two-dimensional electron gas (2DEG) regions are generated adjacent to the first heterojunction and the second heterojunction to transport carriers laterally;

a gate electrode received by the nitride-based multiple semiconductor layer structure and vertically aligning with the aperture in the drift region, wherein the second nitride-based semiconductor layer has a recess to receive the gate electrode and a bottom separating the gate electrode from the first nitride-based semiconductor layer, and a bottom surface of the recess is located between a top surface of the second nitride-based semiconductor layer and a bottom surface of the second nitride-based semiconductor layer;

a gate insulator layer disposed between the nitride-based multiple semiconductor layer structure and the gate electrode; and a source electrode disposed over the first nitride-based semiconductor layer and abutting against the first and second heterojunctions of the nitride-based multiple semiconductor layer structure, wherein the source electrode is electrically coupled with the 2DEG regions adjacent to the first heterojunction and the second heterojunction.

2. The semiconductor device of claim 1, wherein the second heterojunction is located over the first heterojunction, and the first and second heterojunctions extend horizontally above the aperture in the drift region.

3. The semiconductor device of claim 2, wherein the first and second heterojunctions are parallel with each other.

4. The semiconductor device of claim 2, wherein the gate electrode extends upward from a position lower than the first heterojunction to a position higher than the second heterojunction.

5. The semiconductor device of claim 1, wherein the nitride-based multiple semiconductor layer structure has a trench to receive the gate insulator layer and the gate electrode.

6. The semiconductor device of claim 5, wherein the trench of the nitride-based multiple semiconductor layer structure is fully filled with the gate insulator layer and the gate electrode.

7. The semiconductor device of claim 5, wherein the gate insulator layer wraps around sidewalls and a bottom surface of the gate electrode in the trench.

8. The semiconductor device of claim 5, wherein the gate electrode in the trench is separated from the first nitride-based semiconductor layer and the nitride-based multiple semiconductor layer structure by the gate insulator layer.

9. The semiconductor device of claim 1, wherein each of the first and second heterojunctions comprises a heterojunction formed by two different III-V layers selected from AlGaN, GaN, InAlN, and AlN.

10. The semiconductor device of claim 1, wherein the nitride-based multiple semiconductor layer structure further comprises:

a fourth nitride-based semiconductor layer disposed over the third nitride-based semiconductor layer; and a fifth nitride-based semiconductor layer disposed on the fourth nitride-based semiconductor layer and having a bandgap higher than a bandgap of the fourth nitride-based semiconductor layer so as to form the second heterojunction therebetween.

11. The semiconductor device of claim 10, wherein the second nitride-based semiconductor layer is in contact with the doped barrier regions and the aperture in the drift region.

12. The semiconductor device of claim 10, wherein the gate electrode penetrates the third nitride-based semiconductor layer, the fourth nitride-based semiconductor layer, and the fifth nitride-based semiconductor layer, wherein the gate electrode has a bottom surface located within a thickness of the second nitride-based semiconductor layer.

13. The semiconductor device of claim 10, wherein the third nitride-based semiconductor layer and the fifth nitride-based semiconductor layer have different thickness than each other.

14. The semiconductor device of claim 10, wherein the third nitride-based semiconductor layer and the fifth nitride-based semiconductor layer have different concentrations with respect to a group III element.

15. A method for manufacturing a semiconductor device, comprising:

forming at least two doped barrier regions in a first nitride-based semiconductor layer to define an aperture in a drift region;

forming a nitride-based multiple semiconductor layer structure over a first nitride-based semiconductor layer, comprising forming at least two heterojunctions which are separated from each other, further comprising:

forming a second nitride-based semiconductor layer over the first nitride-based semiconductor layer; forming a third nitride-based semiconductor layer on the second nitride-based semiconductor layer, wherein the third nitride-based semiconductor layer has a bandgap higher than a bandgap of the second nitride-based semiconductor layer, and has a material different from a material of the second nitride-based semiconductor layer, so as to form one of the at least two heterojunctions therebetween, wherein two-dimensional electron gas (2DEG) regions are generated adjacent to the at least two heterojunctions to transport carriers laterally;

removing a portion of the nitride-based multiple semiconductor layer structure to form a trench;

forming a gate insulator layer in the trench;

forming a gate electrode in the trench such that the gate electrode is wrapped by the gate insulator layer and vertically aligning with the aperture in the drift region, wherein a bottom of the trench separates the gate electrode from the first nitride-based semiconductor layer, and a bottom surface of the trench is located between a top surface of the second nitride-based semiconductor layer and a bottom surface of the second nitride-based semiconductor layer; and forming a source electrode in contact with the nitride-based multiple semiconductor layer structure to electrically couple with the at least two heterojunctions; wherein the source electrode is electrically coupled with the 2DEG regions adjacent to the at least two heterojunctions.

16. The method of claim 15, wherein forming the nitride-based multiple semiconductor layer comprises:

forming a fourth nitride-based semiconductor layer over the third nitride-based semiconductor layer; and forming a fifth nitride-based semiconductor layer on the fourth nitride-based semiconductor layer and having a bandgap higher than a bandgap of the fourth nitride-based semiconductor layer.

17. The method of claim 16, wherein removing the portion of the nitride-based multiple semiconductor layer structure is performed such that a bottom of the second nitride-based semiconductor layer is exposed from the trench.

18. The method of claim 16, wherein the third nitride-based semiconductor layer and the fifth nitride-based semiconductor layer have different thickness than each other.

19. The method of claim 16, wherein the third nitride-based semiconductor layer and the fifth nitride-based semiconductor layer have different concentrations with respect to a group III element.

* * * * *